US006660610B2

(12) United States Patent
Robinson

(10) Patent No.: US 6,660,610 B2
(45) Date of Patent: *Dec. 9, 2003

(54) DEVICES HAVING IMPROVED CAPACITANCE AND METHODS OF THEIR FABRICATION

(75) Inventor: Karl M. Robinson, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/676,708

(22) Filed: Jul. 8, 1996

(65) Prior Publication Data

US 2001/0050384 A1 Dec. 13, 2001

(51) Int. Cl.⁷ .......................................... H01L 21/8242

(52) U.S. Cl. ...................... 438/396; 438/240; 438/253; 438/785

(58) Field of Search ................................ 438/240, 396, 438/397, 398, 253, 254, 255, 960, 964, 785; 427/80; 428/629

(56) References Cited

U.S. PATENT DOCUMENTS 4,089,039 A * 5/1978 Young ........................ 361/322
4,200,474 A   4/1980 Morris ....................... 148/1.5

(List continued on next page.)

FOREIGN PATENT DOCUMENTS

| JP | 2191330    |   | 7/1990 |             |
|----|------------|---|--------|-------------|
| JP | 04-044204 A| * | 2/1992 | ... H01G/9/04 |
| JP | 05-121275 A| * | 5/1993 | ... H01G/9/04 |

OTHER PUBLICATIONS

Genta, V., et al., "TiO2 Nonreflecting Films on Solar Cells", Alta Frequenca, 39(6), 545–548, (Jun. 1970).
Electrochemical synthesis of barium titanate thin films, J. Matter, Res., vol. 11, No. 1, Jan. 1996.
Characterization of Defect States Responsible for Leakage Current in Tantalum Pentoxide Films for Very–High–Density Random Access Memory (DRAM) Applications Jpn. J. Appl. Phys. vol. 34. (1995) Pt. 1, No. 2B.
Scanning Electrochemical Microscopy of Native Titanium Oxide Films. Mapping the Potential Dependence of Spatially–Localized Eelctrochemical Reactions J. Phys. Chem. 1995, 99, 16430–16435.
Energetics of Semiconductor Eelctrode/Solution Interfaces: EQCM Evidence for Charge–Compensating Cation Adsorption and Intercalation during Accumulation Layer Formation in the Titanium Dioxide/Acetonitrile System J. Phys. Chem. 1995,99,15718–15720.
Growth model for $PbTiO_3$ thin films grown by surface–reaction enhanced metalorganic chemical vapor deposition Appl. Phys. Lett. 67(9), Aug. 28, 1995.
Ultrathin $SrTiO_3$ films prepared by chemical vapor deposition on Nb–doped $SrTiO_3$ substrates Appl. Phys. Lett 67 (17), Oct. 23, 1995.
Pulsed laser deposition of $BaTiO_3$ thin films and their optical properties Appl. Phys. Lett 67 (13), Sep. 25, 1995.
Deposition of extremely thin $(Ba,Sr)TiO_3$ thin films for ultra–large–scale integrated dynamic random access memory application Appl. Phys. Lett. 67 (19), Nov. 6, 1995.

(List continued on next page.)

Primary Examiner—Carl Whitehead, Jr.
Assistant Examiner—Toniae M. Thomas
(74) Attorney, Agent, or Firm—Schwegman, Lundberg, Woessner & Kluth, P.A.

(57) ABSTRACT

A capacitor formed by a process using only two deposition steps and a dielectric formed by oxidizing a metal layer in an electrolytic solution. The capacitor has first and second conductive plates and a dielectric is formed from the first conductive plate.

41 Claims, 11 Drawing Sheets

U.S. PATENT DOCUMENTS

| | | | | |
|---|---|---|---|---|
| 4,243,494 A | * | 1/1981 | Riggs, Jr. et al. | 205/49 |
| 4,244,800 A | * | 1/1981 | Frazzini et al. | 204/195 R |
| 4,251,326 A | | 2/1981 | Arcidiacono et al. | 204/15 |
| 4,385,966 A | * | 5/1983 | Keller et al. | 205/125 |
| 4,450,048 A | * | 5/1984 | Gaulier | 204/15 |
| 4,458,295 A | * | 7/1984 | Durschlag et al. | 361/322 |
| 4,521,446 A | | 6/1985 | Coleman, Jr. et al. | 427/86 |
| 4,665,608 A | * | 5/1987 | Okamoto et al. | 438/251 |
| 4,936,957 A | * | 6/1990 | Dickey et al. | 204/37.1 |
| 5,049,517 A | | 9/1991 | Liu et al. | 437/52 |
| 5,053,351 A | | 10/1991 | Fazan et al. | 437/52 |
| 5,061,650 A | | 10/1991 | Dennison et al. | 437/47 |
| 5,068,199 A | * | 11/1991 | Sandhu | 438/255 |
| 5,082,797 A | | 1/1992 | Chan et al. | 437/52 |
| 5,097,381 A | | 3/1992 | Vo | 361/313 |
| 5,134,085 A | | 7/1992 | Gilgen et al. | 437/52 |
| 5,155,057 A | | 10/1992 | Dennison et al. | 437/47 |
| 5,168,073 A | | 12/1992 | Gonzalez et al. | 437/47 |
| 5,185,075 A | * | 2/1993 | Rosenberg et al. | 205/234 |
| 5,192,703 A | | 3/1993 | Lee et al. | 437/52 |
| 5,196,364 A | | 3/1993 | Fazan et al. | 437/52 |
| 5,234,856 A | | 8/1993 | Gonzalez | 437/47 |
| 5,262,343 A | | 11/1993 | Rhodes et al. | 437/52 |
| 5,321,649 A | | 6/1994 | Lee et al. | 365/149 |
| 5,354,705 A | | 10/1994 | Mathews et al. | 437/52 |
| 5,372,962 A | * | 12/1994 | Hirota et al. | 438/398 |
| 5,381,302 A | | 1/1995 | Sandhu et al. | 361/305 |
| 5,382,817 A | | 1/1995 | Kashihara et al. | 257/295 |
| 5,392,189 A | | 2/1995 | Fazan et al. | 361/305 |
| 5,416,348 A | | 5/1995 | Jeng | 257/297 |
| 5,438,011 A | | 8/1995 | Blalock et al. | 437/52 |
| 5,463,483 A | * | 10/1995 | Yamazaki | 349/41 |
| 5,508,881 A | * | 4/1996 | Stevens | 361/305 |
| 5,563,089 A | | 10/1996 | Jost et al. | 437/60 |
| 5,625,233 A | * | 4/1997 | Cabral, Jr. et al. | 257/771 |
| 5,685,968 A | * | 11/1997 | Hayakawa et al. | 205/122 |
| 5,696,394 A | | 12/1997 | Jones, Jr. et al. | 257/295 |
| 5,708,302 A | | 1/1998 | Azuma et al. | 257/751 |
| 5,739,565 A | * | 4/1998 | Nakamura et al. | 257/309 |
| 5,811,990 A | | 9/1998 | Blodgett et al. | 326/81 |
| 5,876,788 A | | 3/1999 | Bronner et al. | 427/81 |
| 5,893,731 A | * | 4/1999 | Lee et al. | 438/238 |
| 5,960,294 A | | 9/1999 | Zahurak et al. | 438/398 |
| 6,025,257 A | * | 2/2000 | Jeon | 438/608 |
| 6,051,885 A | | 4/2000 | Yoshida | 257/775 |
| 6,226,173 B1 | * | 5/2001 | Welsch et al. | 361/508 |
| 6,261,917 B1 | | 7/2001 | Quek et al. | 438/396 |
| 6,323,078 B1 | | 11/2001 | Bhowmik et al. | 438/238 |

OTHER PUBLICATIONS

Electrochemical and Thermal Oxidation of TiN Coatings Studied by XPS Surface and Interface analysis. Vol 23, 529–539 (1995).

Electrochemical Behavior and Surface Chemistry of Non–equilibrium Aluminum–Tantalum Alloys: Solute–Rich Interphase Mechanisms Surface and Interface Analysis, vol. 23, 609–617 (1995).

Performance of tantalum–silicon–nitride diffusion barriers between copper and silicon dioxide Appl. Phys. Lett. 67 (15), Oct. 9, 1995.

Effects of Small Amount of Water on Physical and Electrical Properties of $TiO_2$ Films Deposited by CVD Method—Technical Notes vol. 135, No. 1.

A simple Chemical Vapour Deposition Mehtod for Depositing Thin $TiO_2$ Films—Preparation and Characterization Thin Solid Films, 109 (1983) 169–178.

Investigations of $TiO_2$ Films Deposited by Different Techniques—Preparation and Characterization Thin Solid Films, 197 (1991) 279–285.

Reactive ion plating of $TiO_2$—Vacuum/vol. 34/No. 1–2/pp. 291 to 294/1984.

Chemical Deposition of TiO2 Layers on GaAs.

Photoelectrochemical Properties of Polycrystalline $TiO_2$ Thin Film Eelctrodes on Quartz Substrate—J. Electrochem. Soc.: Electrochemical Science and Technology, Vol 130, No. 2, Feb. 1983.

Preparation of Titanium Dioxide Films as Solar Photocatalysts—Solar Energy materials 1 (1979) 233–236.

The Chemical Deposition of Dispersion Coatings with Ni–P and Ni–B Matrices. Embedding of Oxides: Titanium Dioxide—Galvanotechnik, 1973, 64, 23–28.

Film Antiriflettenti Di TiO2 Su Celle Solari—vol. XXXIX—N. 6—Giugno 1970.

Chemical vapor Deposition of Thin Film Dielectrics.

* cited by examiner

DEVICES HAVING IMPROVED CAPACITANCE AND METHODS OF THEIR FABRICATION

BACKGROUND

Although there have been attempts to deposit metal oxides, such as TiO2 and SrTiO3, during semiconductor fabrication, thermal oxidation of metals in the fabrication of capacitors has been limited since an initial oxide layer prohibits further diffusion during thermal oxidation. As a result the use of high dielectric constant oxidized metals has been limited in semiconductor capacitor fabrication. One such metal, titanium dioxide, has a dielectric constant 2–15 times greater than present semiconductor capacitor dielectrics such as silicon nitride, while titanates are 2–1000 times greater.

In the January 1996 issue of Material Research, Vol. 11, No. 1, an article entitled ELECTROCHEMICAL SYNTHESIS OF BARIUM TITANATE THIN FILMS, R. R. Bacsa et al. describes the synthesizing of polycrystalline films of barium titanate on titanium substrates by the galvanostatic anodization of titanium to form a material which has a dielectric constant of 200.

SUMMARY OF THE INVENTION

The invention includes new capacitor structures and dielectrics and methods for forming such capacitors and dielectrics.

In one exemplary embodiment the capacitor of the invention is formed by a process using only two deposition steps. The capacitor has first and second conductive plates and a dielectric is formed from the first conductive plate.

In one exemplary process in accordance with the present invention a metal layer is deposited and at least partially oxidized in an electrolytic solution. The metal oxide formed during this oxidation forms the dielectric of the capacitor. Portions not oxidized may form at least a portion of a capacitor plate.

In one exemplary implementation in accordance with the present invention, a metal layer is deposited to overlie a first capacitor plate fabricated on a semiconductor wafer. The wafer is placed in an electrolyte conducive to forming an oxide with the metal. A potential is applied across the electrolyte and the metal, and at least a portion of the metal oxidizes. In a preferred embodiment the metal is titanium and titanium dioxide is formed during the electrochemical reaction. The capacitor fabrication is completed with the formation of a second capacitor plate overlying the oxidized metal layer. The oxidized metal layer functions as the dielectric of the capacitor and has a high dielectric constant.

DETAILED DESCRIPTION OF THE PREFERRED EMBODIMENTS

Figure 1:
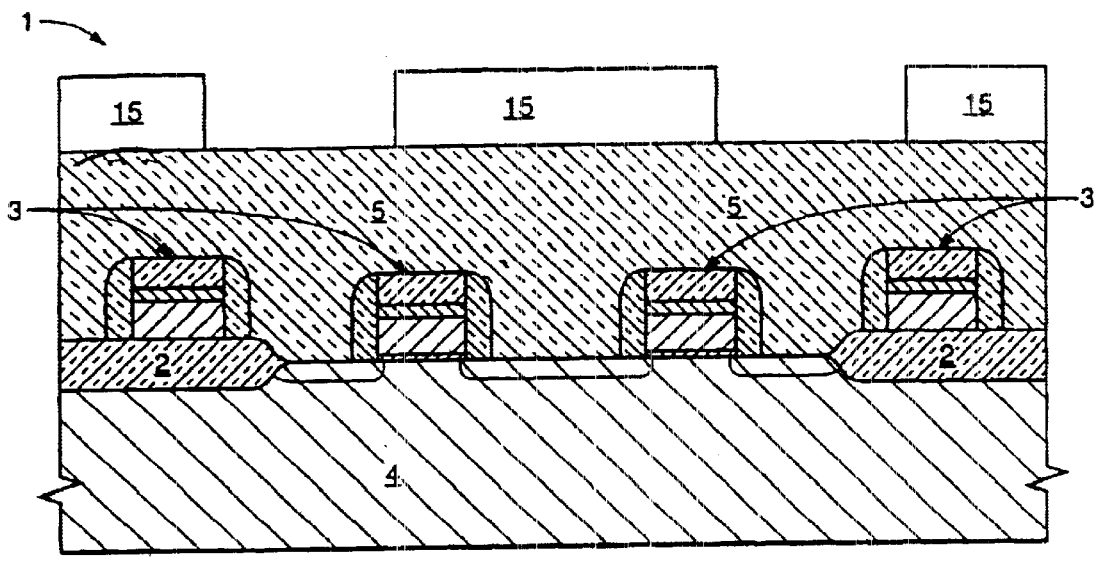
FIG. 1 is a cross section of a semiconductor wafer following the formation of a silicon dioxide layer and the masking thereof.

FIGS. 1–7 depict cross sectionally a semiconductor wafer 1 following the process steps of a first embodiment used in fabricating the wafer 1. In FIG. 1 field oxide regions 2 and wordlines 3 have been formed overlying a substrate 4 using conventional semiconductor process methods. Following the wordline formation a thick layer of silicon dioxide 5 is deposited to a thickness approximately equal to 5000 angstroms and then planarized. The silicon dioxide 5 is masked to define future capacitor substrate contact regions with mask layer 15.

Figure 2:
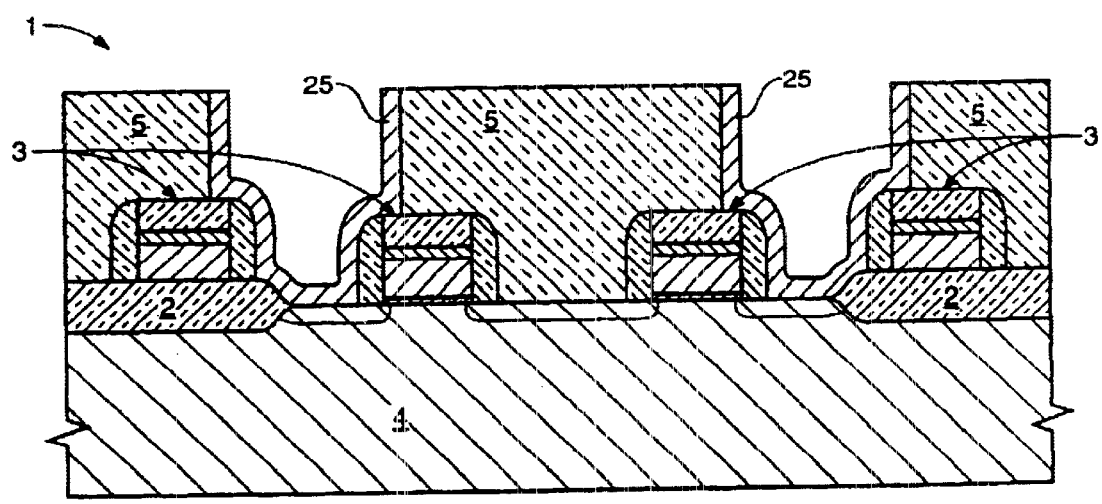
FIG. 2 is the cross section of FIG. 1 following an etch of the silicon dioxide layer and following a deposition and etch of polysilicon.

In FIG. 2 the silicon dioxide 5 is anisotropically dry etched to expose the substrate 4 in the unmasked regions. Following the etch a substantially conformal first conductive layer 25, preferably a polysilicon layer having a thickness of 200–400 angstroms, is deposited to overly the exposed substrate 4 and the silicon dioxide 5. Following the formation of the conductive layer 25 upper portions of the silicon dioxide layer 5 are exposed by removing portions of the conductive layer 25 using a spacer etch or using CMP (chemical mechanical planarization) following a resist deposit. The removal of portions of the conductive layer 25 creates electrically isolated portions of the conductive layer 25. The isolated portions of conductive layer 25 are first capacitor plates of the capacitor of the invention. Conventional methods for depositing the conductive layer 25 include CVD (chemical vapor deposition), PVD (physical vapor deposition) and electroless deposition. In an alternate embodiment a metal layer is deposited by a conventional method and functions as the first conductive layer 25.

Figure 3:
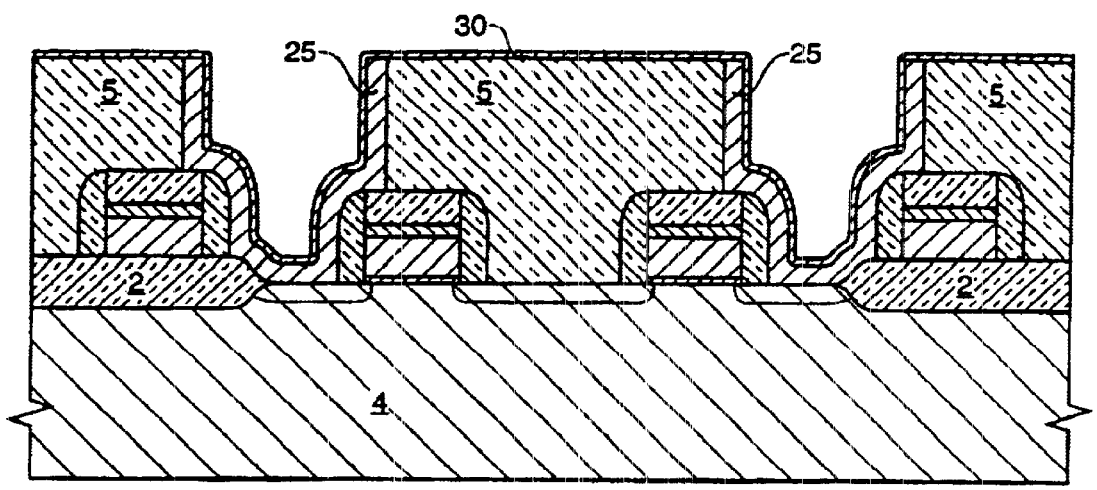
FIG. 3 is the cross section shown in FIG. 2 following a deposition of titanium.

Following the deposition and isolation of portions of the first conductive layer 25 a conformal metal layer 30 is deposited by chemical vapor deposition to overly the first conductive layer 25 and exposed portions of silicon dioxide layer 5, see FIG. 3. In a preferred embodiment the conformal metal layer 30 is titanium having a thickness of approximately 16–100 angstrom. Although in this embodiment titanium is preferred other metals may be used such as copper, gold, tungsten, and nickel. In a case where metal is used as the first conductive layer 25 it may be necessary to form diffusion barrier layer or an oxidation resistant layer or both interposed between the first conductive layer 25 and the metal layers 30. Thus, it should be noted that the first conductive layer 25 may actually be comprised of more than one material. For example in a ministack application a conductive plug and further conductive layers overlying the conductive plug may form the first conductive layer.

Figure 4:
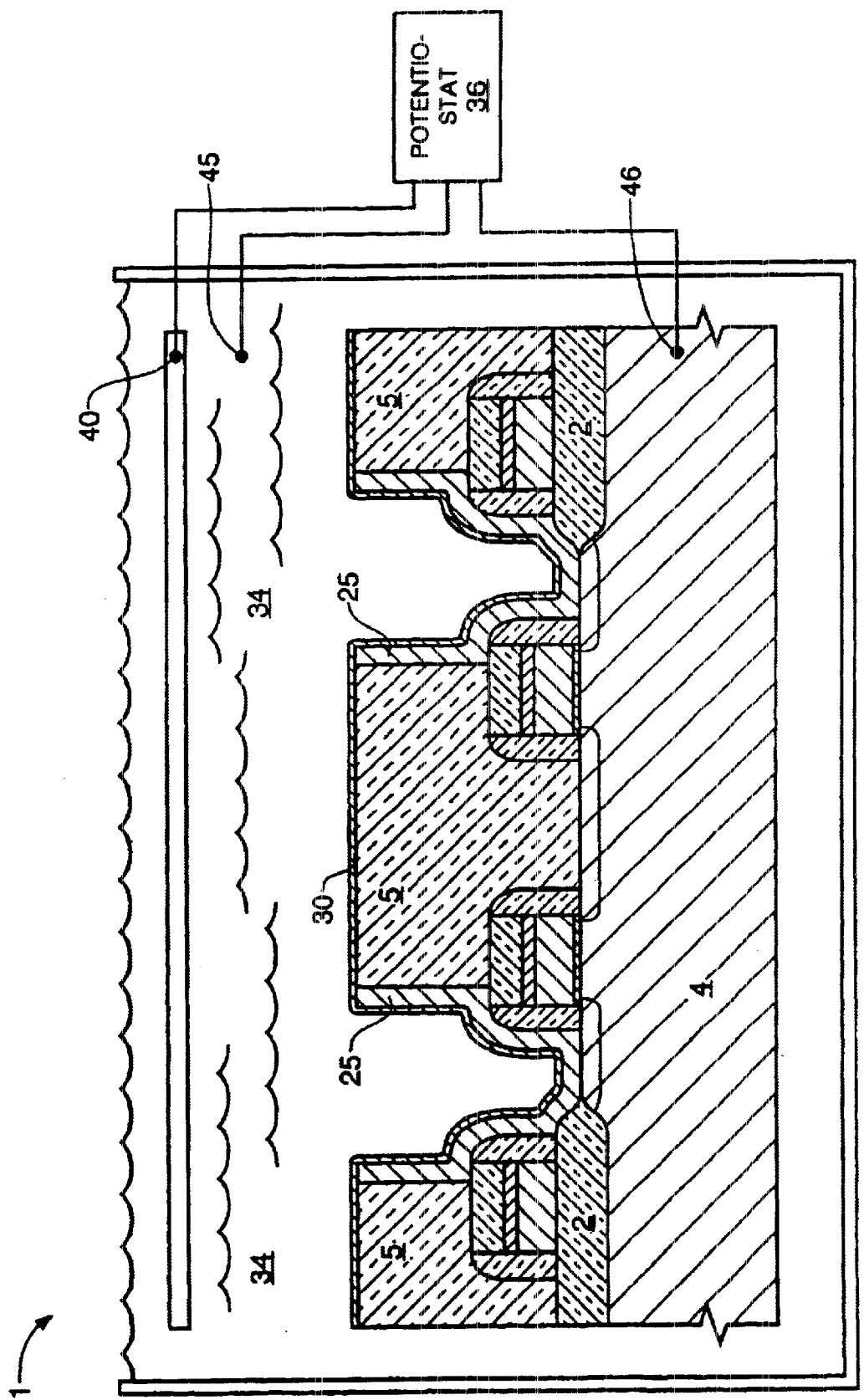
FIG. 4 is the cross section shown in FIG. 3 when placed in an apparatus configured to perform electrochemical oxidation.

In FIG. 4 the wafer 1 is placed in electrolytic solution 34 conducive to oxidizing the metal layer 30 when a potential is applied across the electrolytic solution 34 and the metal layer 30. The electrolytic solution 34 contacts the metal layer 30. In the preferred embodiment the electrolytic solution 34 is water, such as one part NH4OH for 10 parts water or 0.1 Mole HCLO4. However, a basic or acidic solution could also be used. A potentiostat 36 consists of a first electrode 40, known as a counter electrode, and a second electrode 45, known as a reference electrode. Both the first 40 and second 45 electrodes are emersed in the electrolytic solution 34. The potentiostat 36 also provides a third electrode 46, known as the working electrode, which is connected to the substrate 4. The substrate 4 is in electrical communication with the metal layer 30. The potentiostat 36 is a standard device, one of which is a PAR available from E.G.&G. of Princeton, N.J. The preferred reference electrode is an SCE (saturated calomel electrode). The potentiostat 36 monitors the current flowing between the first and third electrodes 40 and 46. The potentiostat controls the potential between the second and third electrodes 45 and 46. Preferably, the potential is in the range of −2.0 volts to 5 volts (i.e. SCE reference electrode) for 5–120 sec depending on the desired thickness of the dielectric. The current is measured between electrodes 40 and 46 and is controlled by varying the potential between the second and third electrodes 45 and 46 to obtain the desired current. The potentiostat allows the potential to be adjusted within a range of potentials conducive to the oxidizing of titanium. The oxidation reaction simultaneously oxidizes the metal layer 30 across the entire wafer surface.

Although in the preferred embodiment a three electrode potentiostat controls the electrochemical oxidation process, a two electrode rheostat control device may also be used. However, the oxidation is less controllable using the two electrode rheostat. When using the rheostat the second electrode 45 is eliminated and the electrochemical reaction changes the counter electrode chemistry. When this happens the potential changes. Thus the oxidation of the metal layer 30 is uncontrolled. In the three electrode preferred embodiment the existence of the reference electrode provides better control of the oxidation process.

Figure 5:
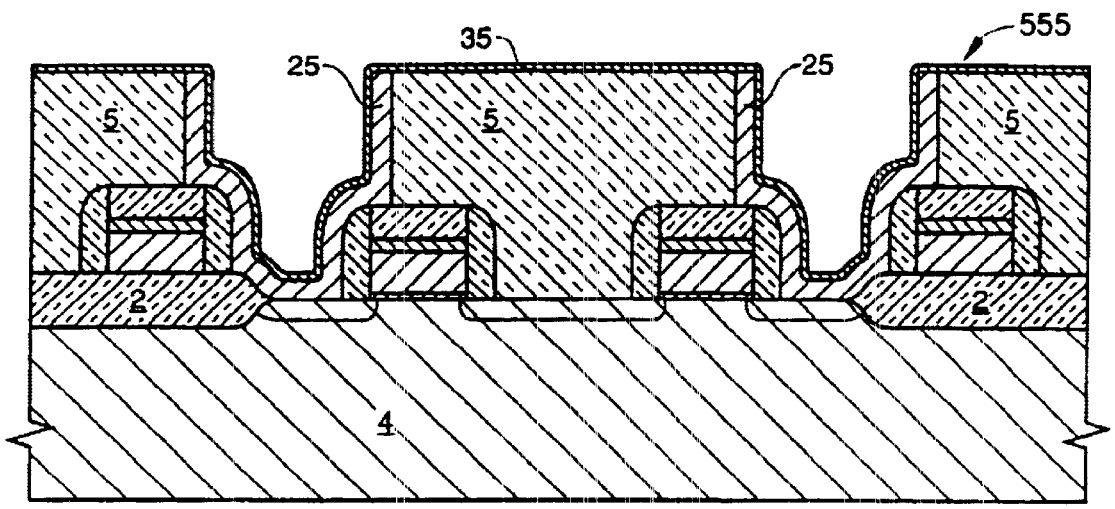
FIG. 5 is the cross section shown in FIG. 4 following the oxidation of the titanium layer.

In the first embodiment substantially all of the metal layer 30 is oxidized during the electrolytic process to form a metal oxide 35, titanium dioxide in the preferred embodiment, see FIG. 5. The titanium dioxide has a high dielectric constant. Preferably, the thickness of the metal oxide ranges between 10–1000 Angstroms and the dielectric constant is between 86 and 170.

Figure 6:
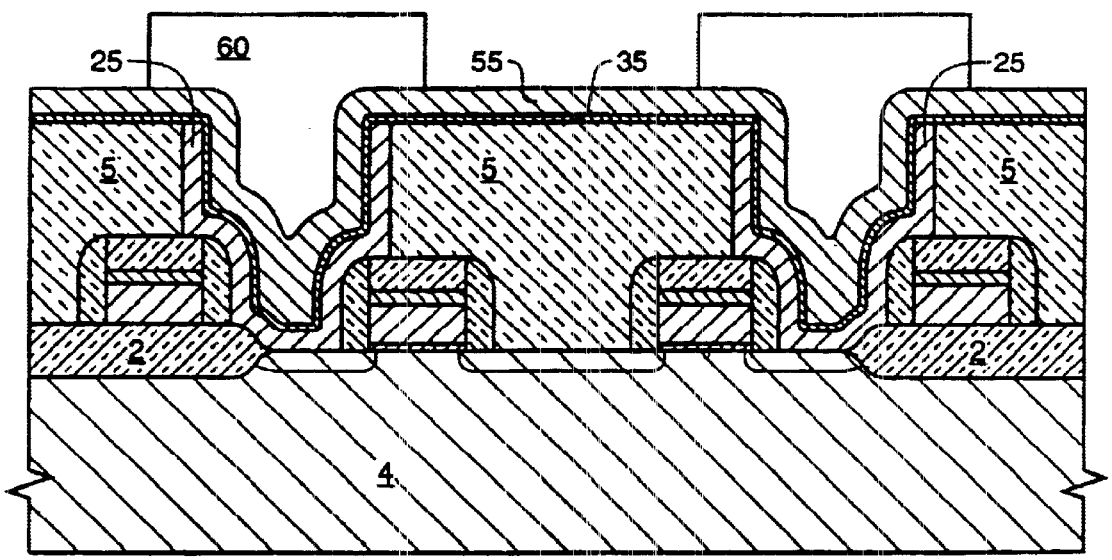
FIG. 6 is the cross section shown in FIG. 5 following the deposition and masking of a conductive layer.

Following the oxidation step the metal oxide is chemically mechanically planarized, indicated by reference number 555, and a second conductive layer 55 is deposited to overlie the silicon dioxide layer 5 and the metal oxide 35, see FIG. 6. The second conductive layer 55 is created using conventional methods such as CVD, PVD, or electroless deposition. In the preferred embodiment the conductive layer 55 is polysilicon although metal may be used instead of polysilicon, and more than one material may be used to form conductive layer 55. A mask 60 is then formed to define the future capacitor structures.

Figure 7:
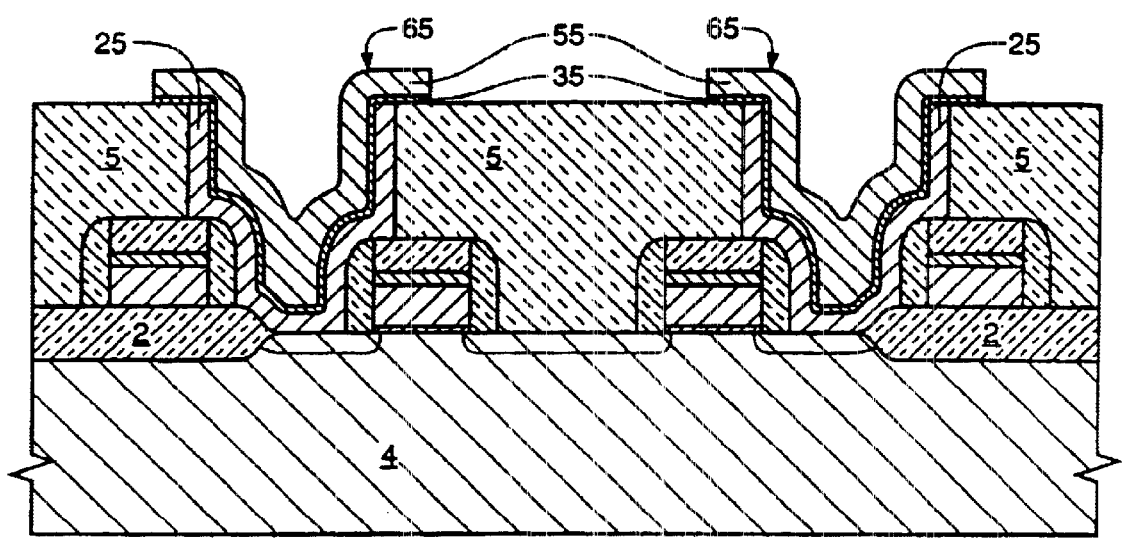
FIG. 7 is the cross section shown in FIG. 6 following the final capacitor formation.

In FIG. 7 the conductive layer 55 has been etched in unmasked regions to complete the capacitor structures 65. The capacitors 65 made by the method of the invention comprises a first capacitor plate which is first conductive layer 25, a second capacitor plate which is the second conductive layer 55, and a dielectric which is the metal oxide 35.

In an alternate embodiment it is only necessary to oxidize a portion of the metal layer 30 to create a metal/metal oxide layer, or in the preferred embodiment a titanium/titanium dioxide layer. In this case the unoxidized metal layer 30 and the polysilicon layer 25 form the first capacitor plate while the thin layer of titanium oxide forms the dielectric.

In a still further alternate embodiment multiple layers of metal are deposited and at least a portion of each metal layer is electrochemically oxidized prior to the deposition of a subsequent metal layer. In this case the dielectric comprises alternate layers of oxide and metal. In this embodiment the second conductive layer 55 is deposited on the last metal oxide created.

In a second embodiment of the invention, shown in FIGS. 8A–12B, a first metal layer 75, such as titanium, is sputter deposited to overly the silicon dioxide layer 5 and to contact exposed portions of substrate 4 following the etch of the silicon dioxide layer 5 shown in FIG. 1. The wafer 1 is then placed in an electrolytic solution of acidic water. A current flows in the electrolytic solution in response to a potential applied across the electrolytic solution. The current is controlled with a potentiostat in order to control the oxidation of the metal layer. By controlling the oxidation it is possible to oxidize only a top portion of the first metal layer 75 to form a first metal oxide 80, see FIG. 9A.

Figure 8A:
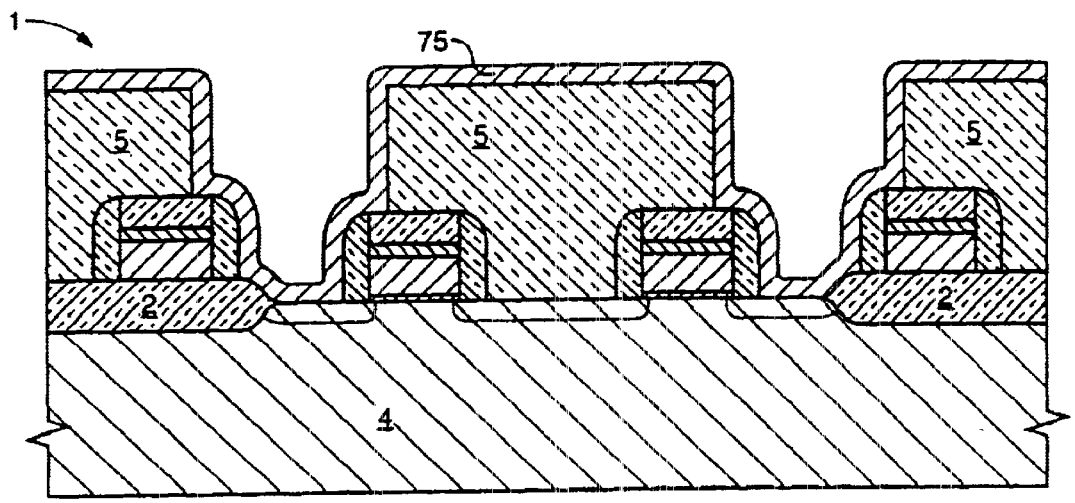
FIG. 8A is the cross section of the semiconductor wafer shown in FIG. 1 following an etch of the silicon dioxide layer and a deposit of a first metal layer.
Figure 8B:
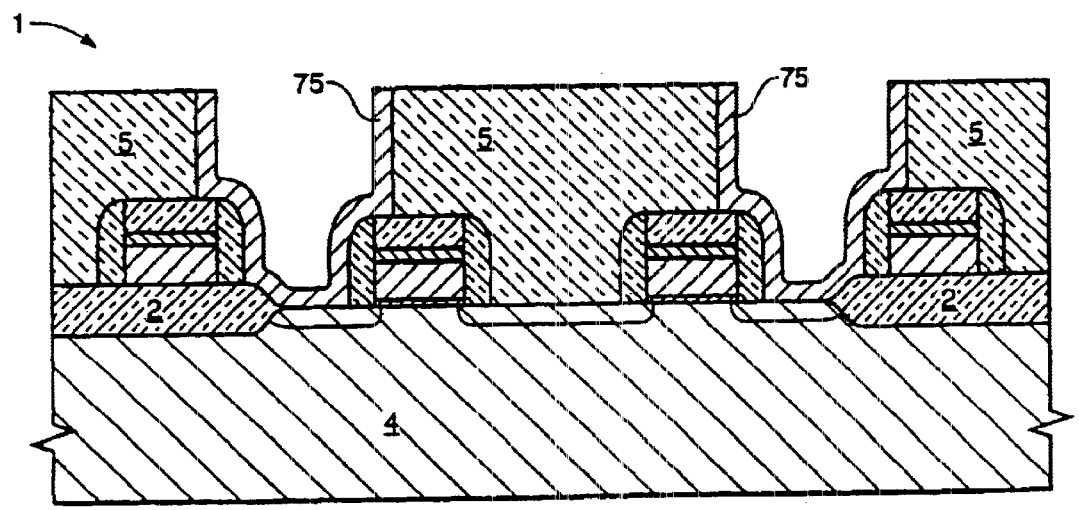
FIG. 8B is the cross section of the semiconductor wafer shown in FIG. 1 following an etch of the silicon dioxide layer and a deposit and planarization of a first metal layer.
Figure 9A:
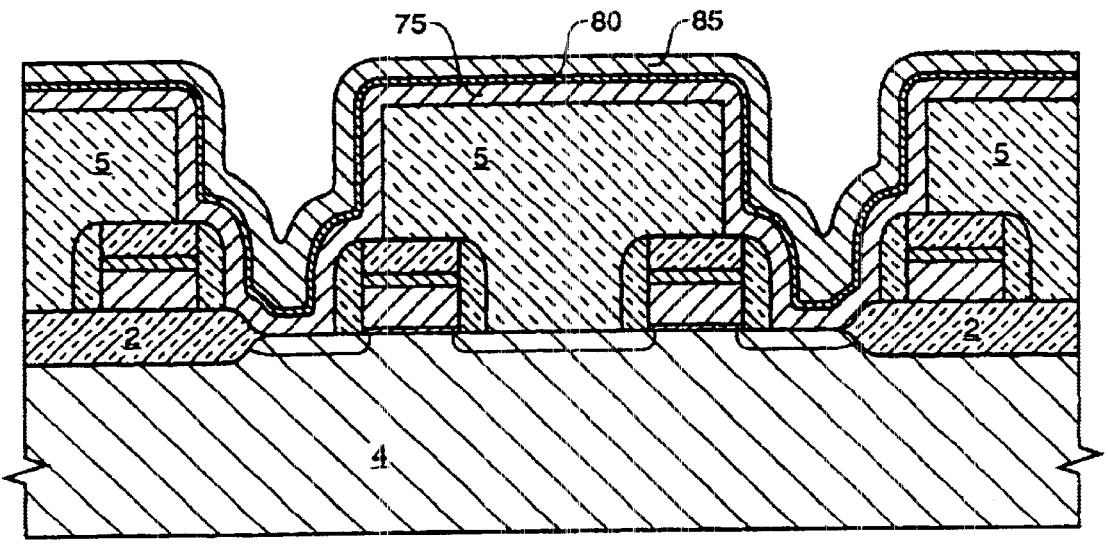
FIG. 9A is the cross section shown in FIG. 8A following the electrochemical oxidation of the first metal layer and a deposit of a second metal layer.
Figure 9B:
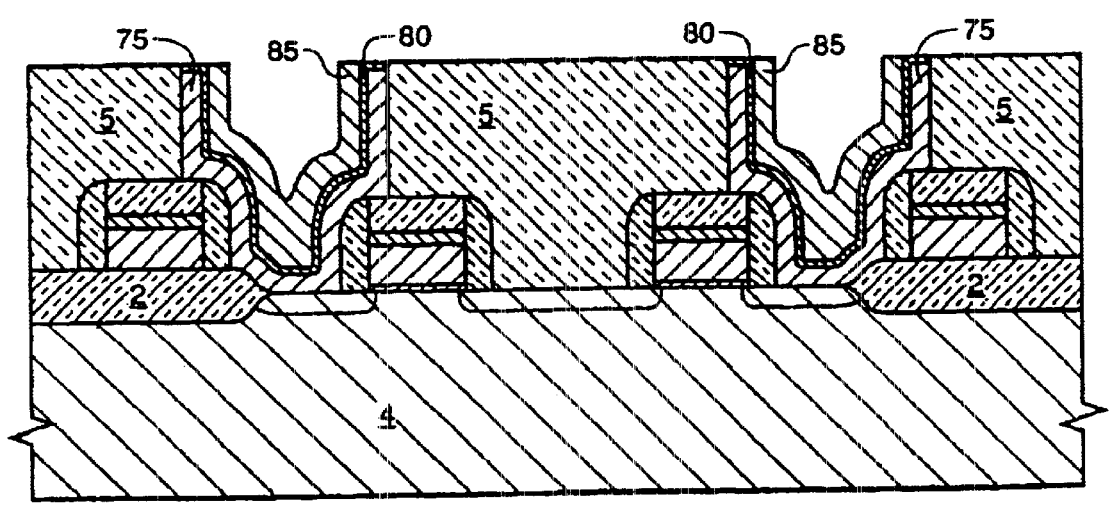
FIG. 9B is the cross section shown in FIG. 8B following the planarization and electrochemical oxidation of the first metal layer and following a deposit and planarization of a second metal layer.

Alternately the metal layer 75 is planarized to expose the silicon dioxide prior to oxidation and formation of the first metal oxide 80, see FIGS. 8B and 9B.

Following the first oxidation a second metal layer 85, FIG. 9A, is sputter deposited to overlie the first metal oxide 80. Again the wafer 1 is placed in the electrolytic solution and an upper portion of the second metal layer 85 is oxidized to form a second metal oxide 90, see FIGS. 10A and 10B.

Figure 10A:
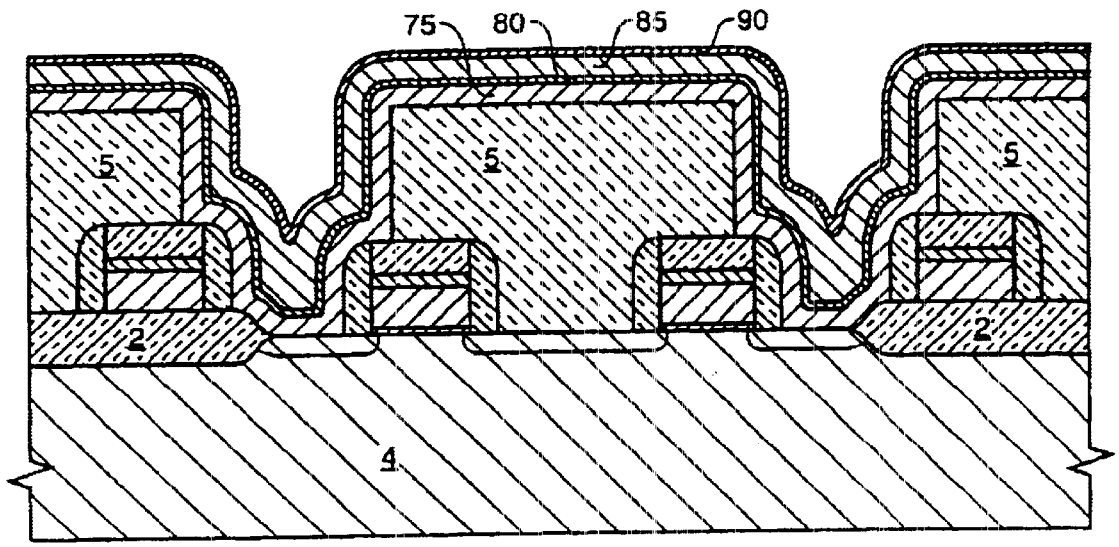
FIG. 10A is the cross section shown in FIG. 9A following an electrochemical oxidation of the second metal layer.
Figure 10B:
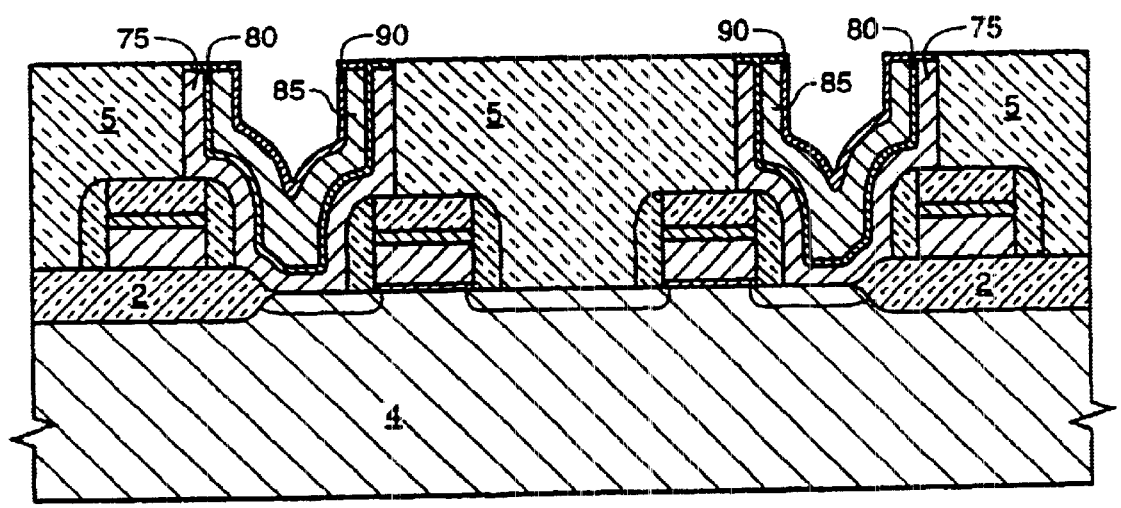
FIG. 10B is the cross section shown in FIG. 9B following a electrochemical oxidation of the second metal layer.

In the alternate embodiment, shown in FIGS. 9B and 10B, the second metal layer 85 has been planarized to expose the silicon dioxide prior to oxidation.

Figure 11A:
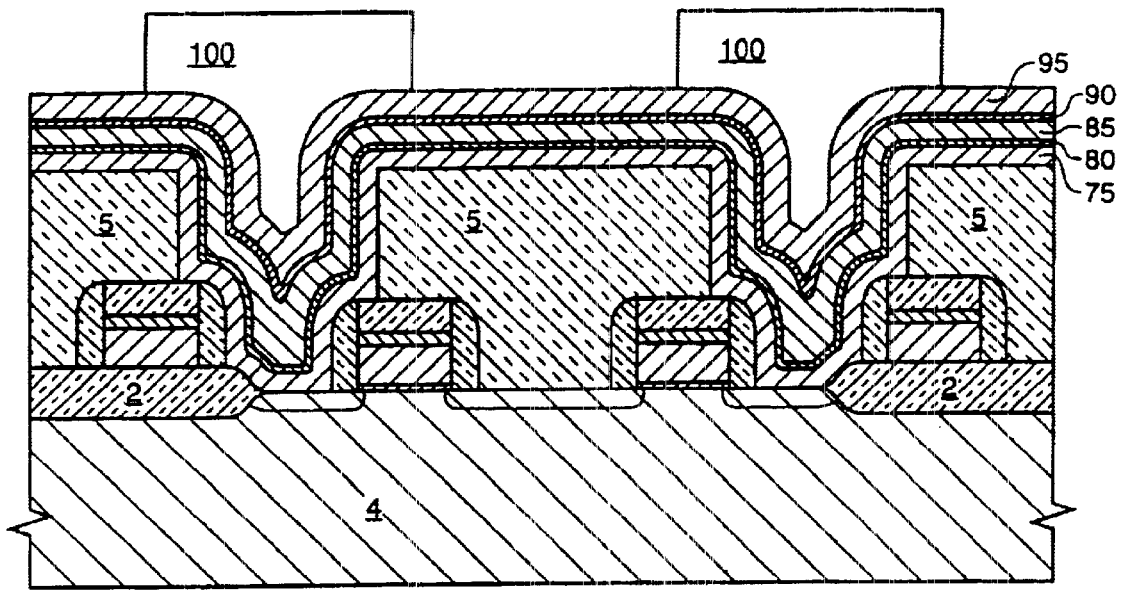
FIG. 11A is the cross section shown in FIG. 10A following the formation of a capacitor plate and the masking thereof.
Figure 11B:
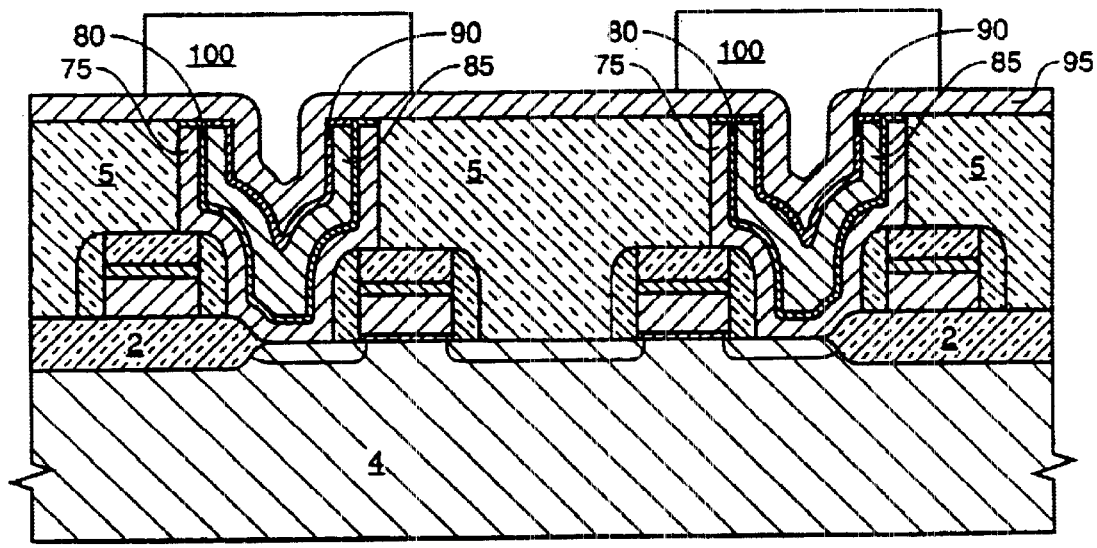
FIG. 11B is the cross section shown in FIG. 10B following the formation of a capacitor plate and the masking thereof.

Following the oxidation of the second metal layer 85 a third metal layer 95 is sputter deposited to overlie the second metal oxide layer 90, and capacitors;are defined by a mask 100, see FIGS. 11A and 11B.

Figure 12A:
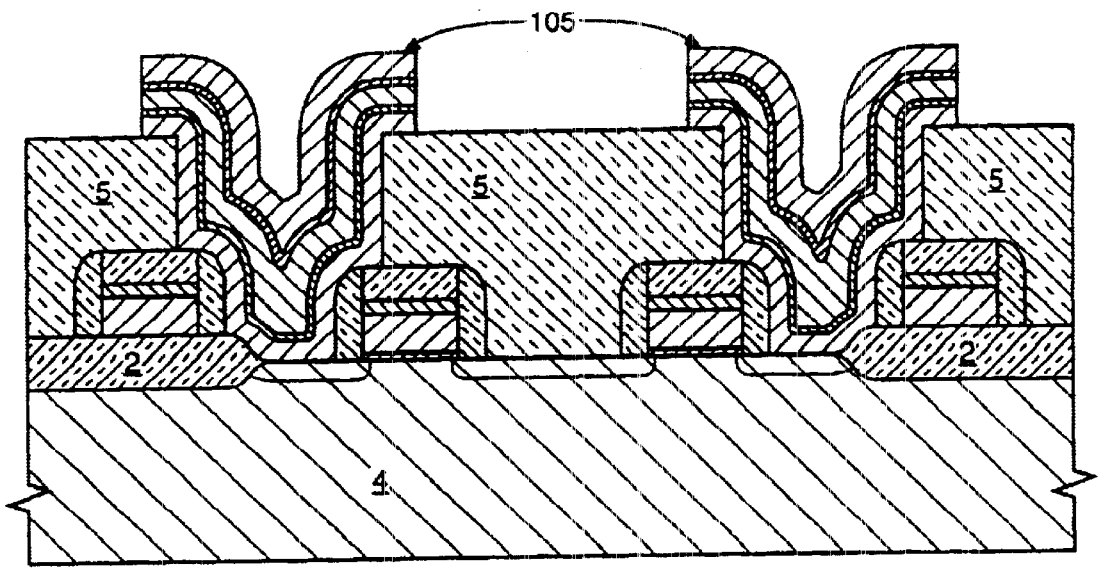
FIG. 12A is the cross section shown in FIG. 11A following an etch and showing one capacitor of the invention.
Figure 12B:
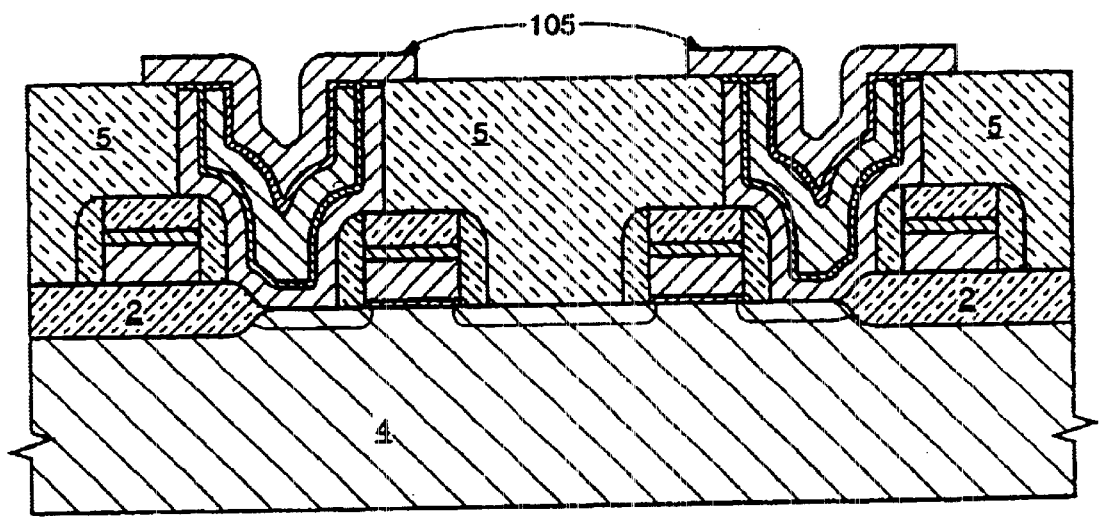
FIG. 12B is the cross section shown in FIG. 11B following an etch and showing one capacitor of the invention.

Exposed first, second and third metal layers 75, 85, and 95 and exposed first and second metal oxide layers 80 and 90 are etched to form the capacitors 105 of the invention, see FIGS. 12A and 12B. First and third metal layers 75 and 95 form first and second capacitor plates of the capacitors 105, and the first and second metal oxide layers 80 and 90 and second metal layer 85 form the dielectric of the capacitors 105. In a preferred embodiment the first, second, and third metal layers 75, 85, and 95 are titanium. Therefore in the preferred embodiment the metal oxide layers 80 and 90 are titanium dioxide. It is also possible to use only one or to use more than the number of metal/metal oxide layers described above as the dielectric layer, or it is possible to oxidize an entire metal layer if it is not the first or last metal layer, deposited.

In further conceived embodiments the metal layer 30 (in this embodiment titanium) may be alloyed with a material, such as Strontium. In this case SrTiO3 is formed during the oxidation performed by the method of the invention. Other titanates may also be formed depending on the alloy used in combination with titanium. For Example, Ba or Pb, may be combined with Ti to form BaTiO3 and PbTiO3, respectively, during oxidation. The process also works for $TiO3^{-2}$ complexes. In a still further embodiment the metal layer 30 (in this embodiment titanium) may be oxidized in a supersaturated $Sr^{+2}$ solution such as Sr(OH)2 to form SrTrO3, in a preferred embodiment.

Figure 13:
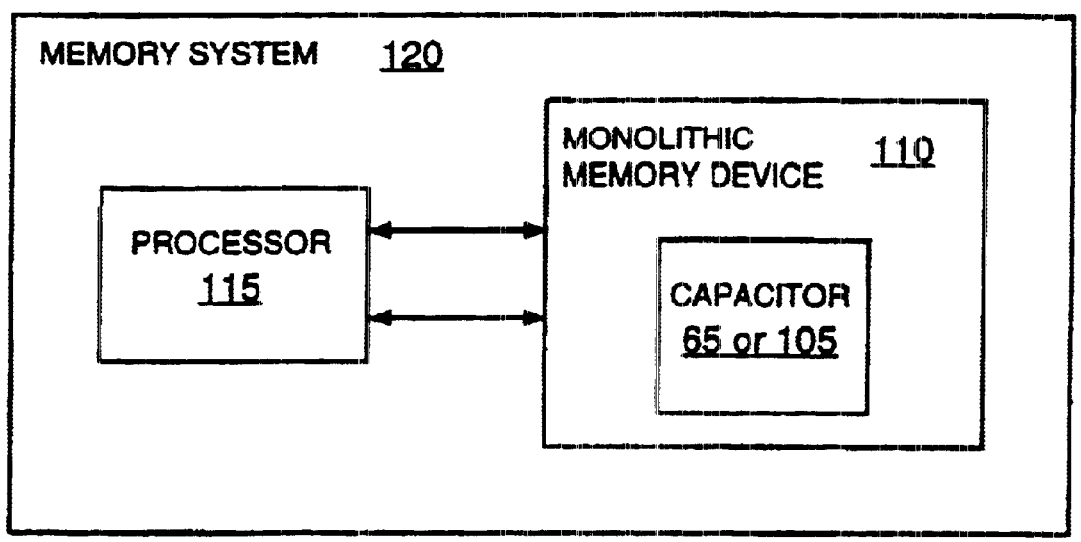
FIG. 13 is a block schematic of a memory system of the invention.

The capacitors 65 and 105 shown in FIGS. 7 and 12(A&B) respectively are typically used in a monolithic memory device 110, such as a dynamic random access memory device, as shown in FIG. 13. The monolithic memory device 110 and a processor 115 form part of a memory system 120. The processor 115 is typically used to generate external control signals which accesses the monolithic memory device 110 either directly or through a memory controller.

It will be evident to one skilled in the art that many different,combinations of materials, deposits and etch steps may be used to fabricate the capacitor and dielectric of the invention without departing from the spirit and scope of the invention as claimed. The method for forming the dielectric of the invention is equally applicable to any type of capacitor structure, such as trench, container, and stacked and ministacked or variations thereof. The following patents: U.S. Pat. Nos. 5,438,011 (Blalock et al.), U.S. Pat. No. 5,097,381 (Vo), U.S. Pat. No. 5,155,057 (Dennison et al.), U.S. Pat. No. 5,321,649 (Lee et al.), U.S. Pat. No. 5,196,364 (Fazan et al.), U.S. Pat. No. 5,381,302 (Sandhu et al.), U.S. Pat. No. 5,392,189 (Fazan et al.), U.S. Pat. No. 5,082,797 (Chan et al.), U.S. Pat. No. 5,134,085 (Gilgen et al.), U.S. Pat. No. 5,354,705 (Mathews et al.), U.S. Pat. No. 5,049,517 (Liu et al.), U.S. Pat. No. 5,053,351 (Fazan et al.), U.S. Pat. No. 5,061,650 (Dennison et al.), U.S. Pat. No. 5,168,073 (Gonzalez et al.), U.S. Pat. No. 5,192,703 (Lee et al), U.S. Pat. No. 5,262,343 (Rhodes et al.), U.S. Pat. No. 5,234,856 (Gonzalez), and U.S. Pat. No. 5,416,348 (Jeng) pertaining to the fabrication of capacitors are herein incorporated by reference. Therefore the invention is only limited by the claims.

What is claimed is:

1. A method for forming a capacitor dielectric on a semiconductor substrate assembly, comprising:

providing said semiconductor substrate assembly;

forming a metal capacitor plate on said substrate assembly;

forming a metal layer overlying the semiconductor substrate assembly, wherein the metal layer includes titanium;

applying a potential across the metal layer; and oxidizing a portion of said metal layer to form at least a portion of the capacitor dielectric.

2. The method as specified in claim 1, further including:

forming the metal layer from a first material;

forming the metal capacitor plate from a second material; and applying the potential across an electrolytic solution and the metal layer to form the dielectric from the metal layer.

3. The method as specified in claim 2, wherein oxidizing a portion of said metal layer includes:

contacting the metal layer with the electrolytic solution; and adjusting the potential across the electrolytic solution to maintain a desired current in the electrolytic solution.

4. The method as specified in claim 2, including:

forming the metal capacitor plate from a first conductive layer by selectively removing portions of the first conductive layer.

5. A method for forming a dielectric layer, comprising:

forming a metal layer of a first material overlying electrically isolated portions of a first conductive layer of a second material formed upon a starting substrate;

contacting the metal layer with an electrolytic solution;

applying a potential across the electrolytic solution and the metal layer, thereby oxidizing at least a portion of the metal layer to form an oxidized layer that forms a portion of the dielectric layer, with non-oxidized portions of the metal layer and the electrically isolated portions of the first conductive layer forming first capacitor plates;

monitoring a current in the electrolytic solution;

adjusting the potential across the electrolytic solution to maintain a desired current in the electrolytic solution;

planarizing the oxidized layer; and forming a second capacitor plate overlying the planarized oxidized layer.

6. The method of claim 5, further comprising:

connecting a first electrode in contact with a surface of the electrolytic solution to a first terminal of a potential source; and connecting the starting substrate to a second terminal of the potential source.

7. The method of claim 6, further comprising:

positioning a third electrode to contact the electrolytic solution; and connecting the third electrode to a third terminal of the potential source.

8. The method of claim 5, further comprising adjusting the potential across the electrolytic solution to control the oxidization of the metal layer.

9. The method of claim 5, wherein the electrolytic solution comprises a solution of one part $NH_4OH$ to ten parts water.

10. The method of claim 5, wherein the electrolytic solution comprises a 0.1 molar solution of $HClO_4$.

11. The method of claim 5, further comprising maintaining the potential across the electrolytic solution within a range between −2.0 volts and 5 volts for a duration between 5 and 120 seconds.

12. The method of claim 5, wherein the metal layer is formed of a metal selected from the group consisting of titanium, copper, gold, tungsten, and nickel.

13. A method of forming a capacitor dielectric on a semiconductor substrate assembly, comprising:

providing said semiconductor substrate assembly;

forming a metal capacitor plate on said substrate assembly;

forming a metal layer overlying the semiconductor substrate assembly;

applying a potential across the metal layer;

oxidizing a portion of said metal layer to form an oxidized layer that constitutes at least a portion of the capacitor dielectric;

mechanically planarizing the oxidized layer; and forming a second conductive layer to serve as a second capacitor plate over the planarized oxidized layer.

14. The method of claim 13, wherein the second conductive layer comprises a polysilicon layer.

15. The method of claim 13, wherein the second conductive layer comprises a metal layer.

16. A method for forming a dielectric layer, comprising:

forming a plurality of field oxide regions, a plurality of wordlines, and a first conductive layer overlying a starting substrate;

selectively removing portions of the first conductive layer to form first capacitor plates;

forming a metal layer overlying the first conductive layer;

contacting the metal layer with an electrolytic solution;

applying a potential across the electrolytic solution and the metal layer, thereby oxidizing at least a portion of the metal layer to form an oxidized layer that forms a portion of the dielectric layer, with non-oxidized portions of the metal layer forming portions of the first capacitor plates;

monitoring a current in the electrolytic solution;

adjusting the potential across the electrolytic solution to maintain a desired current in the electrolytic solution; and forming a second capacitor plate overlying the oxidized layer.

17. The method of claim 16, wherein the first conductive layer comprises a polysilicon layer.

18. The method of claim 16, wherein the first conductive layer comprises a metal layer.

19. The method of claim 18, further comprising forming at least one of a diffusion barrier layer and an oxidation resistant layer interposed between the first conductive layer and the metal layer.

20. The method of claim 16, wherein the first conductive layer is formed using a chemical vapor deposition (CVD) process.

21. The method of claim 16, wherein the first conductive layer is formed using a physical vapor deposition (PVD) process.

22. The method of claim 16, further comprising:

connecting a first electrode in contact with a surface of the electrolytic solution to a first terminal of a potential source; and connecting the starting substrate to a second terminal of the potential source.

23. The method of claim 22, further comprising:

positioning a third electrode to contact the electrolytic solution; and connecting the third electrode to a third terminal of the potential source.

24. The method of claim 16, further comprising adjusting the potential across the electrolytic solution to control the oxidization of the metal layer.

25. The method of claim 16, wherein the electrolytic solution comprises a solution of one part $NH_4OH$ to ten parts water.

26. The method of claim 16, wherein the electrolytic solution comprises a 0.1 molar solution of $HClO_4$.

27. The method of claim 16, further comprising maintaining the potential across the electrolytic solution within a range between −2.0 volts and 5 volts for a duration between 5 and 120 seconds.

28. The method of claim 16, wherein the metal layer is formed of a metal selected from the group consisting of titanium, copper, gold, tungsten, and nickel.

29. The method of claim 16, further comprising:

mechanically planarizing the oxidized layer; and forming a second conductive layer overlying the oxidized layer.

30. The method of claim 16, wherein the second conductive layer comprises a polysilicon layer.

31. The method of claim 16, wherein the second conductive layer comprises a metal layer.

32. A method for forming a capacitor dielectric on a semiconductor substrate assembly, comprising:

providing said semiconductor substrate assembly;

forming a metal capacitor plate of a first material on the substrate assembly;

forming a metal layer of a second material overlying the semiconductor substrate assembly;

applying a potential across the metal layer; and oxidizing a portion of said metal layer to form at least a portion of the capacitor dielectric, wherein the second material is titanium.

33. The method as specified in claim 32, wherein forming the metal capacitor plate including removing portions of a conductive layer of the first material formed atop the semiconductor substrate assembly.

34. The method as specified in claim 32, wherein said oxidizing includes contacting the metal layer with an electrolytic solution.

35. The method as specified in claim 34, further including:

connecting a first electrode in contact with a surface of the electrolytic solution to a first terminal of a potential source; and connecting the semiconductor substrate assembly to a second terminal of the potential source.

36. A method for forming capacitors on a semiconductor substrate assembly, comprising:

providing said semiconductor substrate assembly;

forming a conductive layer atop the semiconductor substrate assembly;

selectively removing portions of the conductive layer to form a plurality of first metal capacitor plates;

forming a metal layer overlying the semiconductor substrate assembly to cover the first metal capacitor plates;

applying a potential across the metal layer;

oxidizing a portion of said metal layer to form a capacitor dielectric for each capacitor; and forming a second metal capacitor plate over each capacitor dielectric, wherein the metal layer is titanium.

37. The method as specified in claim 36, wherein forming the second metal capacitor plate including removing portions of a second conductive layer formed atop the semiconductor substrate assembly.

38. The method as specified in claim 36, wherein said oxidizing includes contacting the metal layer with an electrolytic solution.

39. The method as specified in claim 38, further including:

connecting a first electrode in contact with a surface of the electrolytic solution to a first terminal of a potential source; and connecting the semiconductor substrate assembly to a second terminal of the potential source.

40. A method for forming a capacitor dielectric, comprising:

providing a semiconductor substrate assembly;

forming a metal capacitor plate on said substrate assembly;

forming a metal layer overlying the semiconductor substrate assembly;

contacting the metal layer with an electrolytic solution;

applying a potential across the metal layer and the electrolytic solution; and oxidizing a portion of said metal layer to form an oxide layer to form at least a portion of the capacitor dielectric, wherein the metal capacitor plate comprises polysilicon and the metal layer comprises titanium.

41. The method as specified in claim 40, further including:

planarizing the oxide layer to form a planarized oxide layer; and forming a second capacitor plate over the planarized oxide layer.

* * * * *

UNITED STATES PATENT AND TRADEMARK OFFICE
CERTIFICATE OF CORRECTION

PATENT NO. : 6,660,610 B2  
DATED : December 9, 2003  
INVENTOR(S) : Karl M. Robinson Page 1 of 1

It is certified that error appears in the above-identified patent and that said Letters Patent is hereby corrected as shown below:

Title page,
Item [56], OTHER PUBLICATIONS,
"Energetics of Semiconductor…" reference, delete "Eelctrode" and insert -- Electrode -- therefor.
"A Simple Chemical Vapour…" reference, delete "Mehtod" and insert -- Method -- therefor.
"Chemical Deposition…" reference, delete "TiO2" and insert -- $TiO_2$ -- therefor.

After Item [57], ABSTRACT, delete "41 Claims" and insert -- 40 Claims --

Column 8,
Line 6-9, delete claim 29 in its entirety.

Signed and Sealed this

Twenty-fourth Day of August, 2004

JON W. DUDAS  
*Director of the United States Patent and Trademark Office*